US006689293B2

(12) United States Patent
McClellan et al.

(10) Patent No.: US 6,689,293 B2
(45) Date of Patent: Feb. 10, 2004

(54) CRYSTALLINE RARE-EARTH ACTIVATED OXYORTHOSILICATE PHOSPHOR

(75) Inventors: Kenneth J. McClellan, Los Alamos, NM (US); D. Wayne Cooke, Santa Fe, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 10/160,456

(22) Filed: May 31, 2002

(65) Prior Publication Data

US 2003/0222248 A1 Dec. 4, 2003

(51) Int. Cl.$^7$ ............................ C09K 11/79; C09K 11/78
(52) U.S. Cl. .............................. 252/301.4 F; 250/483.1; 250/361 R
(58) Field of Search .................. 252/301.4 F, 301.4 R; 250/483.1, 361 R

(56) References Cited

U.S. PATENT DOCUMENTS 5,003,181 A * 3/1991 Morlotti .................. 250/484.4
5,540,947 A * 7/1996 Morlotti et al. ............... 427/65
6,573,654 B2 * 6/2003 Juestel et al. ............... 313/586

OTHER PUBLICATIONS

Brandle et al, "Czochralski Growth of Rare–Earth Orthosilicates (Ln2SiO5)", Jour. Xtal Growth, vol. 79, 1986, pp. 308–315.*

Shmulovich et al ,"Single–Crystal Rare–Earth–Doped Yttrium Orthosilicate Phosphors", J.Electrochem. Soc.:Solid State Science and Technology, Dec. 1988, pp. 3141–3151.*

* cited by examiner

Primary Examiner—C. Melissa Koslow
(74) Attorney, Agent, or Firm—Samuel L. Borkowsky

(57) ABSTRACT

Crystalline, transparent, rare-earth activated lutetium oxyorthosilicate phosphor. The phosphor consists essentially of lutetium yttrium oxyorthosilicate activated with a rare-earth metal dopant M and having the general formula $Lu_{(2-x-z)}Y_xM_zSiO_5$, wherein $0.00 \leq x \leq 1.95$, wherein $0.001 \leq z \leq 0.02$, and wherein M is selected from Sm, Tb, Tm, Eu, Yb, and Pr. The phosphor also consists essentially of lutetium gadolinium oxyorthosilicate activated with a rare-earth metal dopant M and having the general formula $Lu_{(2-x-z)}Gd_xM_zSiO_5$, wherein $0.00 \leq x \leq 1.95$, wherein $0.001 \leq z \leq 0.02$, and wherein M is selected from Sm, Tb, Tm, Eu, Yb, and Pr. The phosphor also consists essentially of gadolinium yttrium oxyorthosilicate activated with a rare-earth metal dopant M and having the general formula $Gd_{(2-x-z)}Y_xM_zSiO_5$, wherein $0.00 \leq x \leq 1.95$, wherein $0.001 \leq z \leq 0.02$, and wherein M is selected from Sm, Tb, Tm, Eu, Yb, and Pr. The phosphor may be optically coupled to a photodetector to provide a radiation detector.

16 Claims, 6 Drawing Sheets

CRYSTALLINE RARE-EARTH ACTIVATED OXYORTHOSILICATE PHOSPHOR

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates generally to phosphors and more particularly to a crystalline, transparent, oxyorthosilicate phosphor activated with a rare-earth metal dopant.

BACKGROUND OF THE INVENTION

Phosphors are currently used in many important devices that include fluorescent lamps, RGB (red, green, blue) screens, lasers, and crystal scintillation detectors for radiography. Perhaps the most important property of any phosphor is its brightness, i.e. its quantum efficiency. The quantum efficiency of a phosphor is the ratio of the number of photons that a phosphor absorbs to the number of photons that a phosphor emits. Other important properties of a phosphor include its spectral region of maximum emission, its optical absorption (in particular, its self-absorption), its decay time, and its density. Superior phosphors have a high quantum efficiency, good linearity, fast decay time, and minimal self-absorption.

An exceptionally good phosphor is cerium-activated lutetium oxyorthosilicate. This material has been conveniently abbreviated in the literature as either LSO:Ce or Ce:LSO, and will be referred to herein as LSO:Ce. LSO:Ce is a crystalline solid composed of a host lattice of lutetium oxyorthosilicate ($Lu_2SiO_5$ abbreviated LSO) that is activated with a small amount (e.g. 0.25 atomic percent of Ce relative to Lu) of the rare-earth metal dopant cerium (Ce). Cerium is an excellent activator because both its ground state and excited states lie within the band gap of about 6 eV of the host LSO lattice. LSO:Ce is a very bright crystalline phosphor, i.e. it has a very high quantum efficiency. LSO:Ce also has a high density (7.4 $gm/cm^3$), a fast decay time (about 40 nanoseconds), a band emission maximum near 420 nanometers, and minimal self-absorption. Oxyorthosilicate phosphors, including LSO:Ce, have been documented in the following reports and patents.

"Czochralski Growth of Rare-Earth Orthosilicates ($Ln_2SiO_5$)" by C. D. Brandle et al (J. Crys. Growth, vol. 79, p. 308–315, 1986), describes yttrium oxyorthosilicate (YSO) activated with Ce, Pr, Nd, Sm, Gd, Tb, Er, Tm, or Yb. While gadolinium oxyorthosilicate doped with Tb (GSO:Tb) appears in Table 3 of Brandle, its use is not described.

Single-Crystal Rare-Earth-Doped Yttrium Orthosilicate Phosphors" by J. Shmulovich et al. (J. Electrochem. Soc.:Solid-State Science and Technology, vol. 135, no. 12, p. 3141–3151, 1988), describes single crystals of rare-earth activated YSO prepared according to aforementioned C. D. Brandle et al. Among the phosphors described is a green phosphor containing YSO activated with a mixture of Tb and Gd, and a red phosphor containing YSO activated with a mixture of Tb and Eu.

"Czochralski Growth of Rare Earth Oxyorthosilicate Single Crystals" by C. L. Melcher et al. (J. Crys. Growth, vol.128, p. 1001–1005, 1993) describes the preparation of single crystals of GSO:Ce, LSO:Ce, and YSO:Ce by the Czochralski method.

"Czochralski Growth and Characterization of $(Lu_{1-x}Gd_x)_2SiO_5$" by G. B. Loutts et al. (J. Crys. Growth, vol.174, p. 331–336, 1997), describes the preparation and properties of single crystals of cerium-activated oxyorthosilicates having a crystal lattice of lutetium and gadolinium.

U.S. Pat. No. 4,647,781 to K. Takagi et al. entitled "Gamma Ray Detector," which issued on Mar. 3, 1987, describes a cerium-activated oxyorthosilicate scintillator having the general formula $Gd_{2(1-x-y)}Ln_{2x}Ce_{2y}SiO_5$ wherein Ln is yttrium and/or lanthanum, wherein $0 \leq x \leq 0.5$, and wherein $1 \times 10^{-3} \leq y \leq 0.1$.

U.S. Pat. No. 4,958,080 to C. L. Melcher entitled "Lutetium Orthosilicate Single Crystal Scintillator Detector," which issued on Sep. 18, 1990, describes LSO:Ce.

U.S. Pat. No. 5,025,151 to C. L. Melcher entitled "Lutetium Orthosilicate Single Crystal Scintillator Detector", which issued on Jun. 18, 1991, describes an apparatus that uses the LSO:Ce scintillator of the '080 patent to investigate subsurface earth formations.

U.S. Pat. No. 5,264,154 to S. Akiyama et al. entitled "Single Crystal Scintillator," which issued on Nov. 23, 1993, describes a single crystal cerium-activated oxyorthosilicate scintillator having the general formula $Gd_{2-(x+y)}Ln_xCe_ySiO_5$ wherein Ln is Sc, Tb, Lu, Dy, Ho, Er, Tm, or Yb, wherein $0.03 \leq x \leq 1.9$, and wherein $0.001 \leq y \leq 0.2$.

U.S. Pat. No. 6,323,489 to K. McClellan entitled "Single Crystal Scintillator," which issued on Nov. 27, 2001, describes a single crystal, cerium activated oxyorthosilicate scintillator having the having the general formula $Lu_{(2-x-z)}Y_xCe_zSiO_5$, wherein $0.05 \leq x \leq 1.95$ and $0.001 \leq z \leq 0.02$.

While the properties of LSO:Ce are exceptional, high quality single crystals of LSO:Ce are difficult and expensive to prepare. The high cost, which is at least partly due to the high cost of starting materials (high purity $Lu_2O_3$ powder) and equipment (iridium crucibles for containing the $Lu_2O_3$ powder, which melts at about 2150° C.) also limits efforts to develop other types of crystals with an LSO host lattice. Yet, there remains a need for crystal phosphors and scintillators with exceptional properties.

Therefore, an object of this invention is to provide a crystalline, rare-earth-activated oxyorthosilicate phosphor.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention as embodied and broadly described herein, the invention includes a crystalline, transparent phosphor consisting essentially of lutetium yttrium oxyorthosilicate activated with a rare-earth metal dopant M and having the general formula $Lu_{(2-x-z)}Y_xM_zSiO_5$, wherein $0.00 \leq x \leq 1.95$, wherein $0.001 \leq z \leq 0.02$, and wherein M is selected from Sm, Tb, Tm, Eu, Yb, and Pr.

The invention also includes a radiation detector having a transparent crystalline phosphor that consists essentially of lutetium yttrium oxyorthosilicate activated with a rare-earth metal dopant M and having the general formula $Lu_{(2-x-z)}Y_xM_zSiO_5$, wherein $0.00 \leq x \leq 1.95$, wherein 0.001

$\leq z \leq 0.02$, and wherein M is selected from Sm, Tb, Tm, Eu, Yb, and Pr. The radiation detector includes a photodetector that is optically coupled to the phosphor to detect light from the phosphor.

The invention also includes a transparent crystalline phosphor consisting essentially of lutetium gadolinium oxyorthosilicate activated with a rare-earth metal dopant M and having the general formula $Lu_{(2-x-z)}Gd_xM_zSiO_5$, wherein $0.00 \leq x \leq 1.95$, wherein $0.001 \leq z \leq 0.02$, and wherein M is selected from Sm, Tb, Tm, Eu, Yb, and Pr.

The invention also includes a radiation detector having a transparent crystalline phosphor that consists essentially of lutetium gadolinium oxyorthosilicate activated with a rare-earth metal dopant M and having the general formula $Lu_{(2-x-z)}Gd_xM_zSiO_5$, wherein $0.05 \leq x \leq 1.95$, wherein $0.001 \leq z \leq 0.02$, and wherein M is selected from Sm, Tb, Tm, Eu, Yb, and Pr. The radiation detector includes a photodetector that is optically coupled to the phosphor to detect light from the phosphor.

The invention also includes transparent crystalline phosphor that consists essentially of gadolinium yttrium oxyorthosilicate activated with a rare-earth metal dopant M and having the general formula $Gd_{(2-x-z)}Y_xM_zSiO_5$, wherein $0.00 \leq x \leq 1.95$, wherein $0.001 \leq z \leq 0.02$, and wherein M is selected from Sm, Tb, Tm, Eu, Yb, and Pr.

The invention also includes a radiation detector having a transparent crystalline phosphor consisting essentially of gadolinium yttrium oxyorthosilicate activated with a rare-earth metal dopant M and having the general formula $Gd_{(2-x-z)}Y_xM_zSiO_5$, wherein $0.00 \leq x \leq 1.95$, wherein $0.001 \leq z \leq 0.02$, and wherein M is selected from Sm, Tb, Tm, Eu, Yb, and Pr. The radiation detector includes a photodetector that is optically coupled to the phosphor to detect light from the phosphor.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF THE INVENTION

Figure 1:
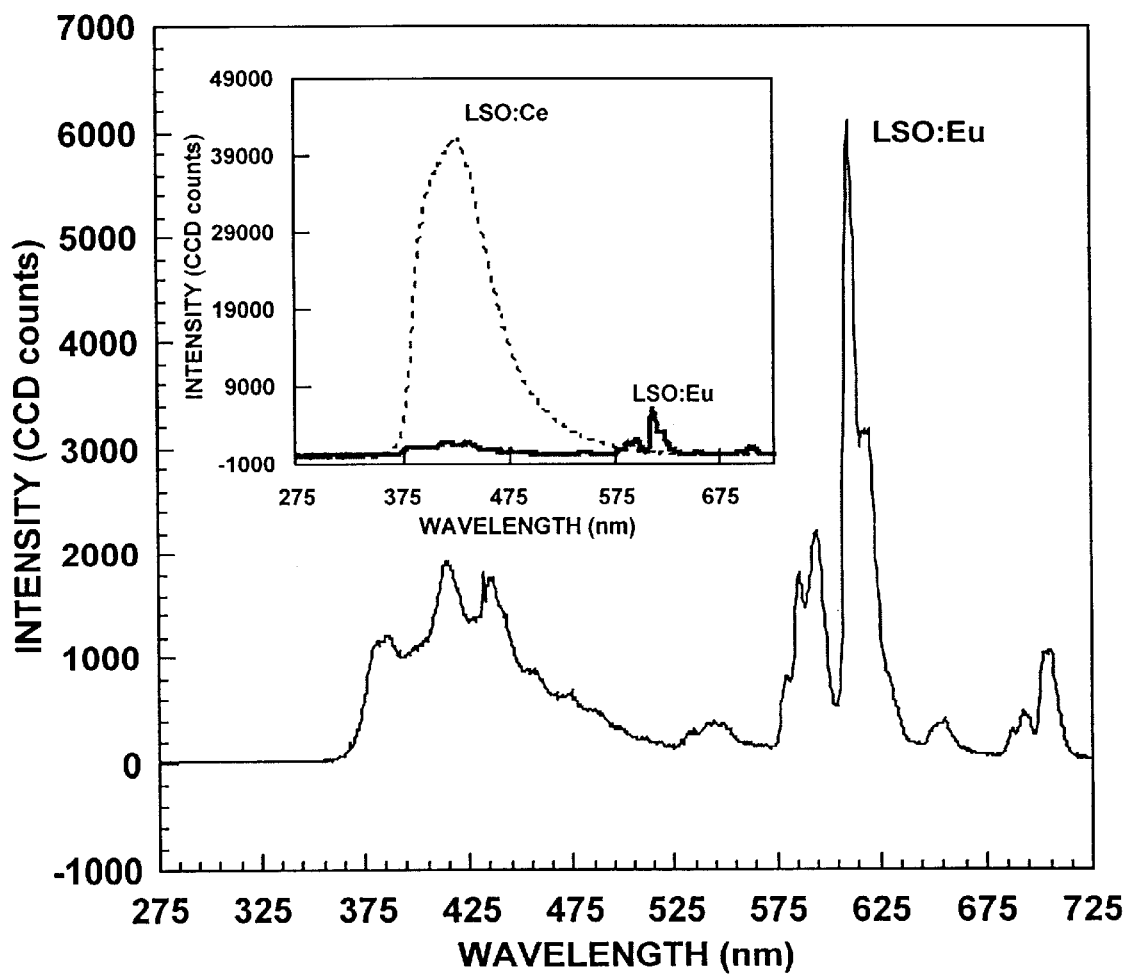
FIG. 1 shows an optical emission spectrum for a LSO:Eu phosphor of the invention and an inset that includes an optical emission spectrum of LSO:Ce for comparison.

The present invention includes a transparent, single crystal phosphor that consists essentially of lutetium yttrium oxyorthosilicate activated with a rare-earth metal ion dopant M and having the general formula $Lu_{(2-x-z)}Y_xM_zSiO_5$, wherein $0.00 \leq x \leq 1.95$, wherein $0.001 \leq z \leq 0.02$, and wherein the dopant metal ion M is selected from Sm, Tb, Tm, Eu, Yb, and Pr. This crystal phosphor is referred to herein by the symbol LYSO:M. Examples of this phosphor wherein x=0, x=0.2, and x=0.8 were prepared as single crystals using the "optical float zone" method. Those crystal phosphors of the invention having no yttrium, i.e. those wherein x=0, are referred to herein by the symbols LSO:Sm, LSO:Tb, LSO:Tm, LSO:Er, LSO:Yb, and LSO:Pr. Each consists essentially of a host lattice of lutetium oxyorthosilicate (LSO) activated with metal dopants Sm, Tb, Tm, Er, Yb, and Pr, respectively. Examples of each of these materials were prepared. Briefly, LSO:Sm, LSO:Tb, and LSO:Tm were much brighter phosphors than LSO:Eu, LSO:Yb, and LSO:Pr. The details of their preparation and optical emission properties of examples of LYSO:M are presented herein The invention also includes a transparent crystalline phosphor that consists essentially of lutetium gadolinium oxyorthosilicate activated with a rare-earth metal ion dopant M and having the general formula $Lu_{(2-x-z)}Gd_xM_zSiO_5$, wherein $0.00 \leq x \leq 1.95$, wherein $0.001 \leq z \leq 0.02$, and wherein M is selected from Sm, Tb, Tm, Eu, Yb, and Pr. This crystal phosphor is referred to herein by the symbol LGSO:M. Examples of this phosphor wherein x=0.2, x=0.8, and x=1 were prepared as single crystals using the optical float zone method. Examples of the crystal phosphor of the invention having no lutetium, i.e. those where x=1, are referred to herein as GSO:Sm, GSO:Tb, GSO:Tm, GSO:Er, GSO:Yb, and GSO:Pr. Details of the preparation of examples of LGSO:M are presented herein.

The invention also includes a transparent crystalline phosphor that consists essentially of gadolinium yttrium oxyorthosilicate that is activated with a rare-earth metal ion dopant M and has the general formula $Gd_{(2-x-z)}Y_xM_zSiO_5$, wherein $0.00 \leq x \leq 1.95$, and $0.001 \leq z \leq 0.02$, and wherein M is selected from Sm, Tb, Tm, Eu, Yb, and Pr. This crystal phosphor is referred to herein by the symbol GYSO:M. Examples of this phosphor wherein x=0 (aforementioned GSO:Sm), x=0.2, and x=0.8 were prepared as single crystals using the optical float zone method. Details of the preparation of examples of GYSO:M are presented herein.

The starting materials used for preparing the crystals of the invention included powders of $SiO_2$, $Lu_2O_3$, $Y_2O_3$, $Gd_2O_3$, and the corresponding oxides of the activating rare-earth metal dopants. Powders of $Lu_2O_3$, $Y_2O_3$, $Gd_2O_3$ were each at least 99.997% pure with respect to other possible rare-earth elements present. Powders of the activating rare-earth metal oxide dopants were each at least 99.99% pure with respect to other possible rare-earth elements present. The particle size for all of the rare-earth oxide powders was −325 mesh. The $SiO_2$ powder had an average particle size of less than 5 μm.

To prepare a crystal of the invention, the corresponding starting powders were weighed to provide a feed composition for a 60-gram batch having the correct stoichiometry. The specific amounts in grams for six different LSO:M compositions of the invention, and the specific amounts in grams for a variety of Sm-activated compositions of the invention are shown below in Table 1 and Table 2, respectively. Details of the preparation of crystals using these invention compositions are provided in the Examples that follow Table 2.

TABLE 1

| Example | Crystal | $SiO_2$ | $Lu_2O_3$ | $Sm_2O_3$ | $Eu_2O_3$ | $Tb_4O_7$ | $Yb_2O_3$ | $Tm_2O_3$ | $Pr_6O_7$ |
|---|---|---|---|---|---|---|---|---|---|
| 1 | LSO:Sm | 7.8738 | 52.0350 | 0.0917 | | | | | |
| 2 | LSO:Eu | 7.8789 | 52.0392 | | 0.0927 | | | | |
| 3 | LSO:Tb | 7.8683 | 52.0374 | | | 0.0979 | | | |
| 4 | LSO:Yb | 7.8716 | 52.0261 | | | | 0.1032 | | |
| 5 | LSO:Tm | 7.8715 | 52.0273 | | | | | 0.1012 | |
| 6 | LSO:Pr | 7.8738 | 52.0377 | | | | | | 0.8940 |

TABLE 2

| Example | Crystal | $Sm_2O_3$ | $SiO_2$ | $Lu_2O_3$ | $Y_2O_3$ | $Gd_2O_3$ |
|---|---|---|---|---|---|---|
| 7 | YSO:Sm | 0.1468 | 12.5996 | | 47.2565 | |
| 8 | GSO:Sm | 0.0991 | 8.5306 | | | 51.3797 |
| 9 | 80/20 LYSO:Sm | 0.0988 | 8.5111 | 45.0062 | 6.3843 | |
| 10 | 20/80 LYSO:Sm | 0.1309 | 11.2480 | 14.8690 | 33.7525 | |
| 11 | 80/20 LGSO:Sm | 0.0928 | 7.9960 | 42.2820 | | 9.6292 |
| 12 | 20/80 LGSO:Sm | 0.0973 | 8.3919 | 11.0929 | | 40.4190 |
| 13 | 80/20 GYSO:Sm | 0.1058 | 9.1205 | | 6.8416 | 43.9325 |
| 14 | 20/80 GYSO:Sm | 0.1338 | 11.5024 | | 34.5138 | 13.8518 |

EXAMPLE 1

A single crystal of LSO:Sm was prepared from a feed rod having the composition shown for example 1 in Table 1. The feed rod was prepared by first preparing a powder mixture by combining 7.8738 grams of $SiO_2$ powder, 52.0350 grams of $Lu_2O_3$ powder, and 0.0917 grams of $Sm_2O_3$ powder. The powder mixture was blended for about 30 minutes in a polystyrene vial with two methacrylate mixing balls using a SPEX 8000 series mixer/mill. The blended powder mixture was loaded into a latex cold isostatic pressing (CIP) tube and pressed at 700 kg/cm² into a rod having a length of about 40 mm and a diameter of about 6.5 millimeters. The pressed rod was fired in air in a furnace so that the components of the blended powder could react to produce a rare-earth doped oxyorthosilicate matrix. The firing schedule, which was used to provide a feed rod of about 55% theoretical density for growing single crystals of ILSO:Sm, involved firing the pressed rod at a temperature of 1000° C. for 20 hours, increasing the temperature to about 1500° C., and firing at 1500° C. for an additional 10 hours. The fired rod was then cooled to room temperature using a standard furnace cool.

The fired rod was then used as the feed rod for growing a single crystal of LSO:Sm. The feed rod was mounted in a dual halogen optical float-zone crystal growth furnace within a quartz tube. A single crystal of LSO:Sm was prepared using a standard float-zone growth procedure. Crystal growth, which was conducted under an atmosphere of flowing nitrogen, was initiated from a polycrystalline seed. A stable molten zone was established between the seed and the feed rod using four 1.5 kW halogen lamps. The feed rod was counter-rotated at 25 rpm and passed through the hot zone. The single crystal was grown at a rate of 15 mm/hr.

EXAMPLE 2

A single crystal of LSO:Eu was prepared from a feed rod having the composition shown for example 2 in Table 1. The feed rod was prepared by first combining 7.8789 grams of $SiO_2$ powder, 52.0392 grams of $Lu_2O_3$ powder, and 0.0927 grams of $Eu_2O_3$ powder. The combined powder was blended, pressed, and fired to produce a feed rod as described for Example 1, and the single crystal of LSO:Eu was also prepared according to the optical float zone method as described for Example 1.

EXAMPLE 3

A single crystal of LSO:Tb was prepared from a feed rod having the composition shown for example 3 in Table 1. The feed rod was prepared by combining 7.8783 grams of $SiO_2$ powder, 52.0374 grams of $Lu_2O_3$ powder, and 0.0979 grams of $Tb_4O_7$ powder. The combined powder was blended, pressed, and fired to produce a feed rod as described for Example 1, and the single crystal of LSO:Tb was also prepared according to the optical float zone method as described for Example 1.

EXAMPLE 4

A single crystal of LSO:Yb was prepared from a feed rod having the composition shown for example 4 in Table 1. The feed rod was prepared by combining 7.8716 grams of $SiO_2$ powder, 52.0261 grams of $Lu_2O_3$ powder, and 0.1032 grams of $Yb_2O_3$ powder. The combined powder was blended, pressed, and fired to produce a feed rod as described for Example 1, and the single crystal of LSO:Yb was also prepared according to the optical float zone method as described for Example 1.

EXAMPLE 5

A single crystal of LSO:Tm was prepared from a feed rod having the composition shown for example 5 in Table 1. The feed rod was prepared by combining 7.8715 grams of $SiO_2$ powder, 52.0273 grams of $Lu_2O_3$ powder, and 0.1012 grams of $Tm_2O_3$ powder. The combined powder was blended, pressed, and fired to produce a feed rod as described for Example 1, and the single crystal of LSO:Tm was also prepared according to the optical float zone method as described for Example 1.

EXAMPLE 6

A single crystal of LSO:Pr was prepared from a feed rod having the composition shown for example 6 in Table 1. The feed rod was prepared by combining 7.8738 grams of $SiO_2$ powder, 52.0377 grams of $Lu_2O_3$ powder, and 0.8940 grams of $Pr_6O_7$ powder. The combined powder was blended, pressed, and fired to produce a feed rod as described for Example 1, and the single crystal of LSO:Pr was also prepared according to the optical float zone method as described for Example 1.

EXAMPLE 7

A single crystal of YSO:Sm was prepared from a feed rod having the composition shown for example 7 in Table 2. The feed rod was prepared by combining 12.5996 grams of $SiO_2$ powder, 47.2556 grams of $Y_2O_3$ powder, and 0.1468 grams of $Sm_2O_3$ powder. The combined powder was blended, pressed, and fired to produce a feed rod as described for Example 1, and the single crystal of YSO:Sm was also prepared according to the optical float zone method as described for Example 1.

EXAMPLE 8

A single crystal of GSO:Sm was prepared from a feed rod having the composition shown for example 8 in Table 2. The feed rod was prepared by combining 8.5306 grams of $SiO_2$ powder, 51.3797 grams of $Gd_2O_3$ powder, and 0.0991 grams of $Sm_2O_3$ powder. The combined powder was blended, pressed, and fired to produce a feed rod as described for Example 1, and the single crystal of GSO:Sm was also prepared according to the optical float zone method as described for Example 1.

EXAMPLE 9

A single crystal of LYSO:Sm was prepared from a feed rod having the composition shown for example 9 in Table 2. The feed rod was prepared by combining 8.5111 grams of $SiO_2$ powder, 45.0062 grams of $Lu_2O_3$ powder, 6.3843 grams of $Y_2O_3$, and 0.0988 grams of $Sm_2O_3$ powder. Sm accounts for about 0.2% of the number of metal atoms in the combined powder. The combined powder was blended, pressed, and fired to produce a feed rod as described for Example 1, and the single crystal of LYSO:Sm was also prepared according to the optical float zone method as described for Example 1. The single crystal consisted essentially of a Sm-doped host lattice having about 80% of the metal sites occupied by Lu and about 20% of the host sites occupied by Y.

EXAMPLE 10

A single crystal of LYSO:Sm was prepared from a feed rod having the composition shown for example 10 in Table 2. The feed rod was prepared by in combining 11.2480 grams of $SiO_2$ powder, 14.8690 grams of $Lu_2O_3$ powder, 33.7525 grams of $Y_2O_3$, and 0.1309 grams of $Sm_2O_3$ powder. Sm accounts for about 0.2% of the number of metal atoms in the combined powder. The combined powder was blended, pressed, and fired to produce a feed rod as described for Example 1, and the single crystal of LYSO:Sm was also prepared according to the optical float zone method as described for Example 1. The single crystal consisted essentially of a Sm-doped host lattice having about 20% of the metal sites occupied by Lu and about 80% of the host sites occupied by Y.

EXAMPLE 11

A single crystal of LGSO:Sm was prepared from a feed rod having the composition shown for example 11 in Table 2. The feed rod was prepared by combining 7.9960 grams of $SiO_2$ powder, 42.2820 grams of $Lu_2O_3$ powder, 9.6292 grams of $Gd_2O_3$, and 0.0928 grams of $Sm_2O_3$ powder. Sm accounts for about 0.2% of the number of metal atoms in the combined powder. The combined powder was blended, pressed, and fired to produce a feed rod as described for Example 1, and the single crystal of LGSO:Sm was also prepared according to the optical float zone method as described for Example 1. The single crystal consisted essentially of a Sm-doped host lattice having about 80% of the metal sites occupied by Lu and about 20% of the host sites occupied by Gd.

EXAMPLE 12

A single crystal of LGSO:Sm was prepared from a feed rod having the composition shown for example 12 in Table 2. The feed rod was prepared by combining 8.3919 grams of $SiO_2$ powder, 11.0929 grams of $Lu_2O_3$ powder, 40.4190 grams of $Gd_2O_3$, and 0.0973 grams of $Sm_2O_3$ powder. Sm accounts for about 0.2% of the number of metal atoms in the combined powder. The combined powder was blended, pressed, and fired to produce a feed rod as described for Example 1, and the CS single crystal of LGSO:Sm was also prepared according to the optical float zone method as described for Example 1. The single crystal consisted essentially of a Sm-doped host lattice having about 20% of the metal sites occupied by Lu and about 80% Li of the host sites occupied by Gd.

EXAMPLE 13

A single crystal of GYSO:Sm was prepared from a feed rod having the composition shown for example 13 in Table 2. The feed rod was prepared by combining 9.1205 grams of $SiO_2$ powder, 43.9325 grams of $Gd_2O_3$ powder, 6.8416 grams of $Y_2O_3$, and 0.1058 grams of $Sm_2O_3$ powder. Sm accounts for about 0.2% of the number of metal atoms in the combined powder. The combined powder was blended, pressed, and fired to produce a feed rod as described for Example 1, and the single crystal of GYSO:Sm was also prepared according to the optical float zone method as described for Example 1. The single crystal consisted essentially of a Sm-doped host lattice having about 80% of the metal sites occupied by Gd and about 20% of the host sites occupied by Y.

EXAMPLE 14

A single crystal of GYSO:Sm was prepared from a feed rod having the composition shown for example 14 in Table 2. The feed rod was prepared by combining 11.5024 grams of $SiO_2$ powder, 13.8518 grams of $Gd_2O_3$ powder, 34.5138 grams of $Y_2O_3$, and 0.1338 grams of $Sm_2O_3$ powder. Sm accounts for about 0.2% of the number of metal atoms in the combined powder. The combined powder was blended, pressed, and fired to produce a feed rod as described for Example 1, and the single crystal of GYSO:Sm was also prepared according to the optical float zone method as described for Example 1. The single crystal consisted essentially of a Sm-doped host lattice having about 20% of the metal sites occupied by Gd and about 80% of the host sites occupied by Y.

Examples of single crystal phosphors of LSO:Sm and LSO:Tb of the invention were also prepared using the Czochralski method; the weights in grams of the powders used are given in Table 3 below. Details of the preparation are given in the Examples that follow Table 3.

TABLE 3

| Example | Crystal | $SiO_2$ | $Lu_2O_3$ | $Sm_2O_3$ | $Tb_4O_7$ |
|---|---|---|---|---|---|
| 15 | LSO:Sm | 47.9645 | 317.0287 | 0.5569 | |
| 16 | LSO:Tb | 41.9832 | 277.4944 | | 0.5220 |

EXAMPLES 15–16

Single crystal phosphors of LSO:Sm and LSO:Tb of the invention were prepared using the Czochralski method. Each was prepared by combining the listed amount of $SiO_2$ with the listed amount of the rare-earth host matrix powder Lu$_2$O$_3$ and the listed amount of dopant powder (Sm$_2$O$_3$ or Tb$_4$O$_7$). Sm (Example 15) or Tb (Example 16) account for about 0.2% of the number of metal atoms in the combined powder. The powder was charged into a 40-mm high by 40-mm inner diameter iridium crucible using one pre-growth melting run. A single crystal of each phosphor with a nominal diameter of 22 mm was grown from an undoped LSO seed rod. Each crystal was grown under a flowing ultra-high purity nitrogen atmosphere with 2000 ppm of oxygen, a seed rotation rate of 20 rpm, and a crystal growth rate of 2.0–2.2 mm per hour.

Samples of about the same size were harvested from each float zone grown single crystal prepared according to Examples 1–14 and used for optical characterization. Emission spectra were obtained for each sample by exciting the sample at room temperature with a low-energy x-ray source having an energy of excitation (E$_{ex}$) of about 25 keV and an exposure rate of about 1.75 Gy/s in air. The light from each sample was recorded with a cooled CCD camera that was mounted onto the exit slit of a grating monochromator. All measurements were made under identical conditions intensity (e.g. 250 $\mu$m entrance and exit slit widths and 60 second integration time) to allow sample-to-sample comparisons of emission spectra.

The optical emission spectra for the crystal samples of LSO:Sm, LSO:Eu, LSO:Tb, LSO:Yb, LSO:Tm, and LSO:Pr are shown in the accompanying Figures. Each optical emission spectrum is presented as a graph of intensity in CCD counts versus wavelength of light. The figures include the optical emission spectrum of LSO:Ce for comparison.

Figure 2:
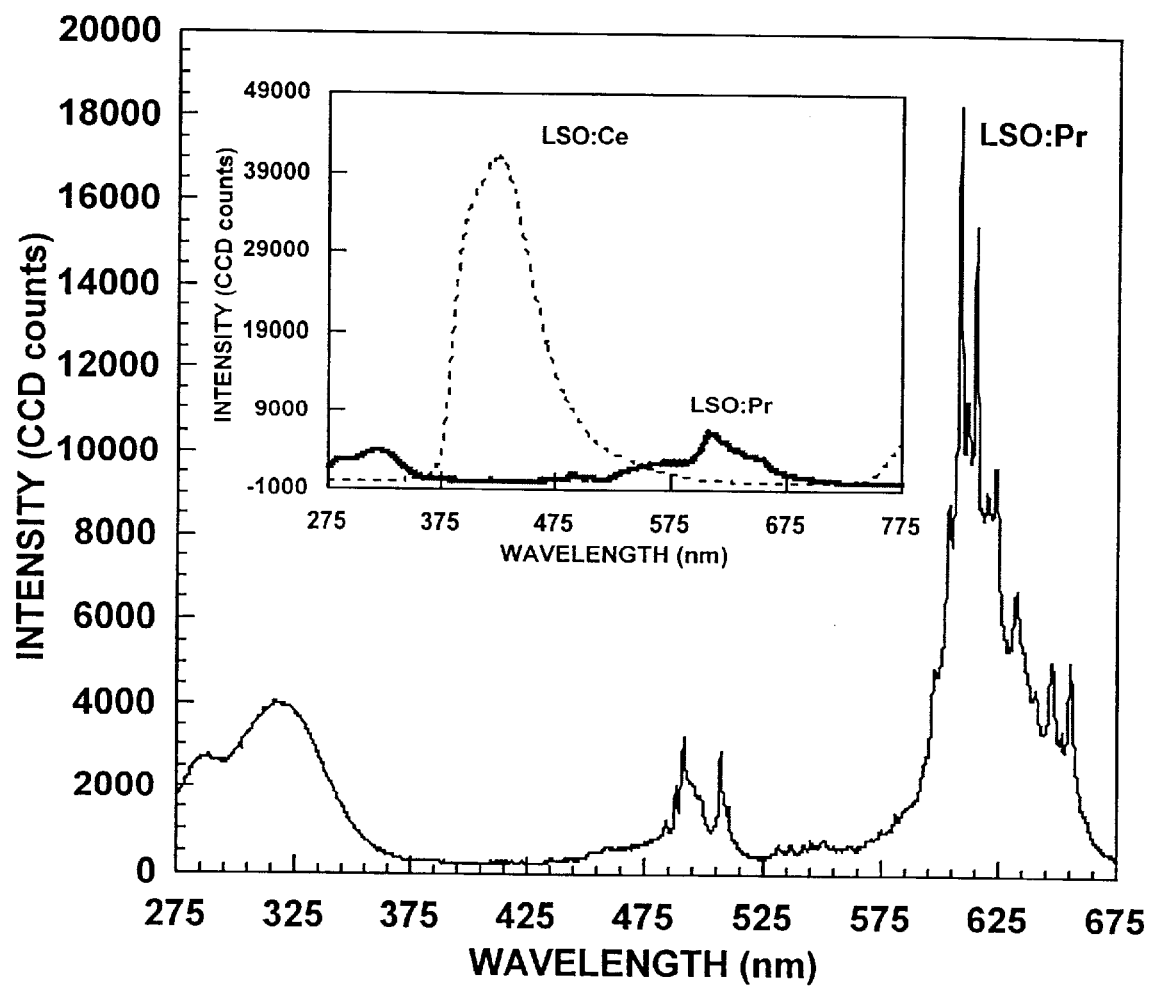
FIG. 2 shows an optical emission spectrum for a LSO:Pr phosphor of the invention and an inset that includes an optical emission spectrum of LSO:Ce for comparison.
Figure 3:
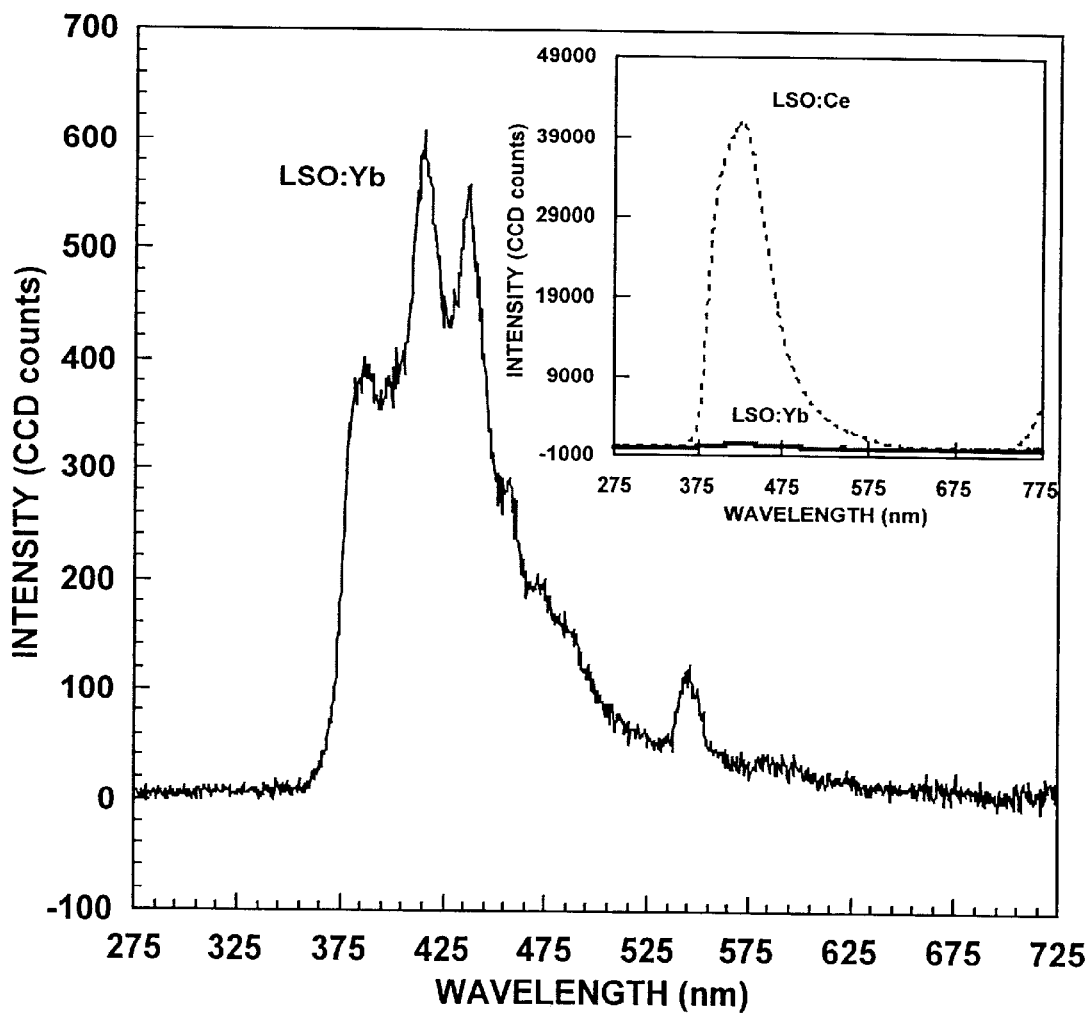
FIG. 3 shows an optical emission spectrum for a LSO:Yb phosphor of the invention and an inset that includes an optical emission spectrum of LSO:Ce for comparison.

Turning now to the Figures, FIGS. 1–3 show the optical emission spectra for LSO:Eu, LSO:Pr, and LSO:Yb, respectively. FIGS. 1–3 each include inset that shows the optical emission spectrum of the corresponding phosphor along with the optical spectrum of LSO:Ce for comparison. As FIGS. 1–3 show, all of the crystals appear to exhibit an emission characteristic of the corresponding dopant, although the emission for LSO:Yb, shown in FIG. 3, is very weak. The emission intensity for LSO:Eu, as shown in FIG. 1, and that for LSO:Pr, shown in FIG. 2, both have a maximum intensity of about 7000 CCD counts at about 615 nanometers. In short, the invention phosphors LSO:Eu, LSO:Pr, and LSO:Yb all exhibit low luminescence and appear to be relatively poor phosphors compared to LSO:Ce.

Figure 4:
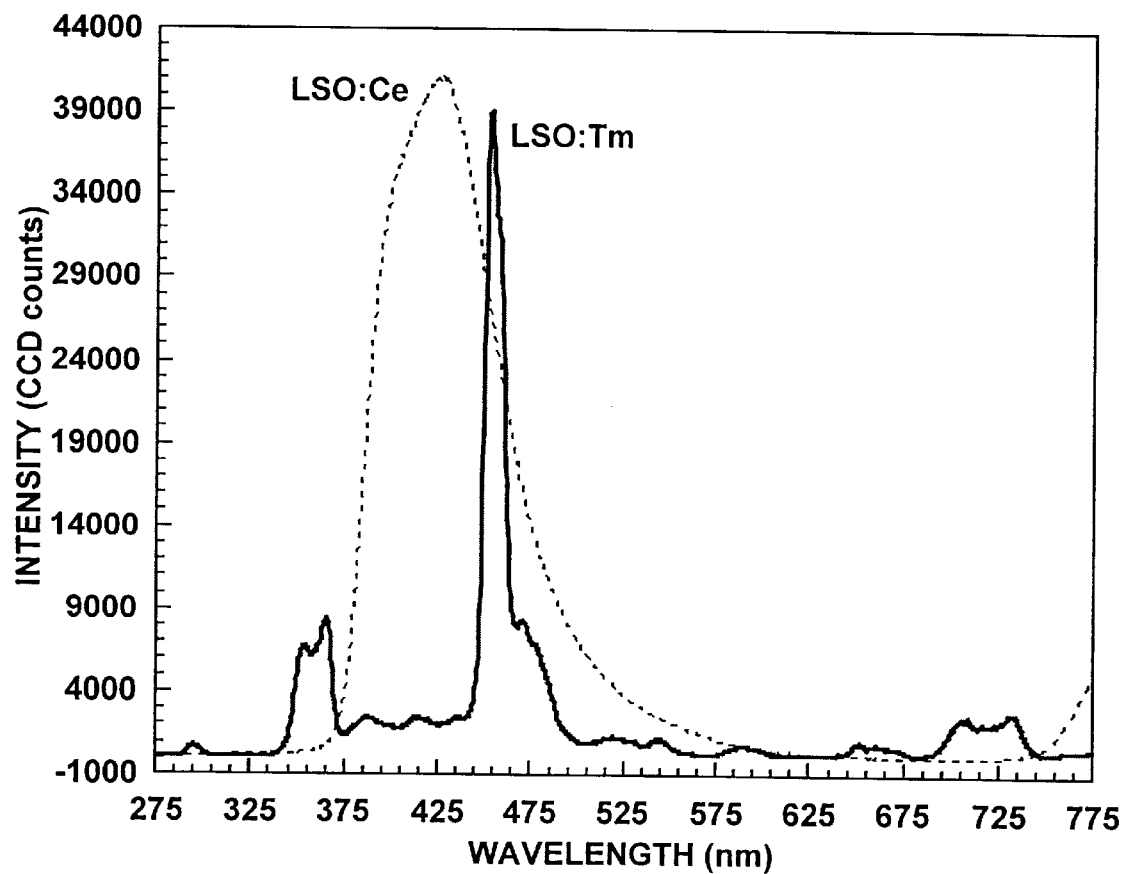
FIG. 4 shows an optical emission spectrum for a LSO:Tm phosphor of the invention and an optical emission spectrum of LSO:Ce for comparison.
Figure 5:
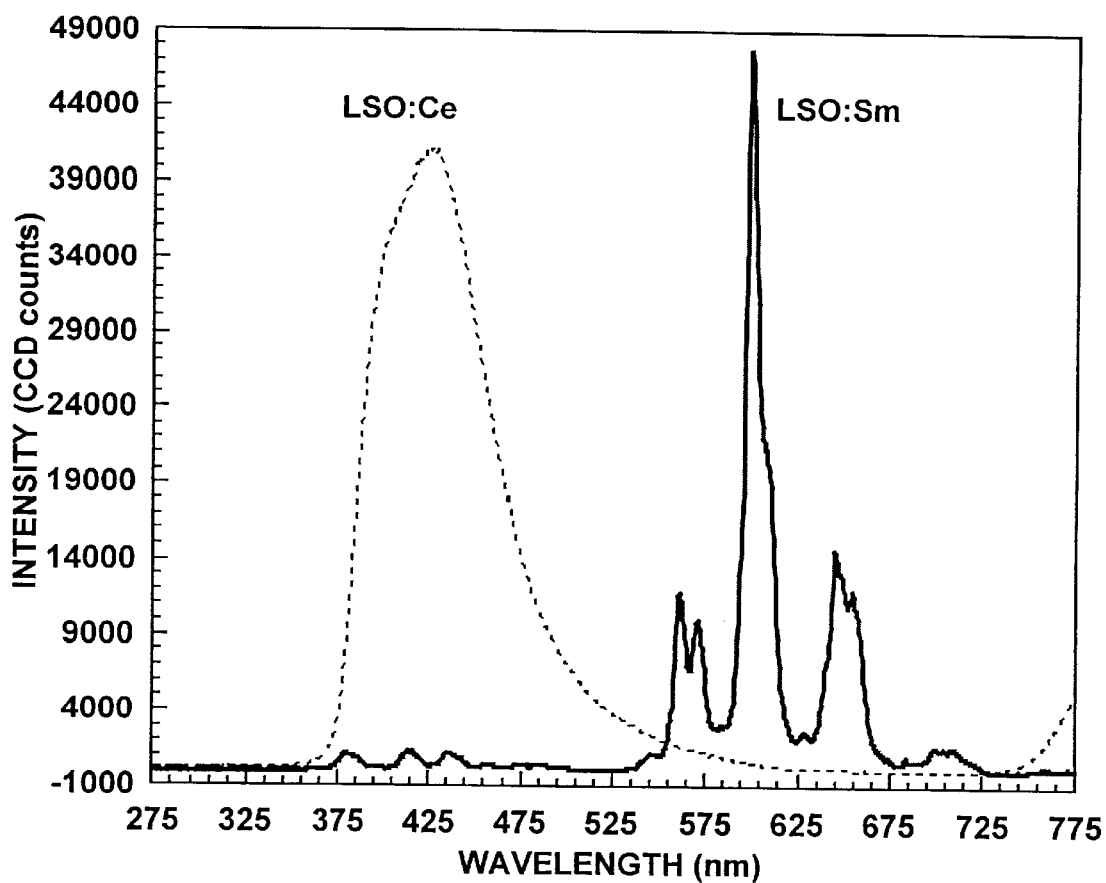
FIG. 5 shows an optical emission spectrum for a LSO:Sm phosphor of the invention and an optical emission spectrum of LSO:Ce for comparison.
Figure 6:
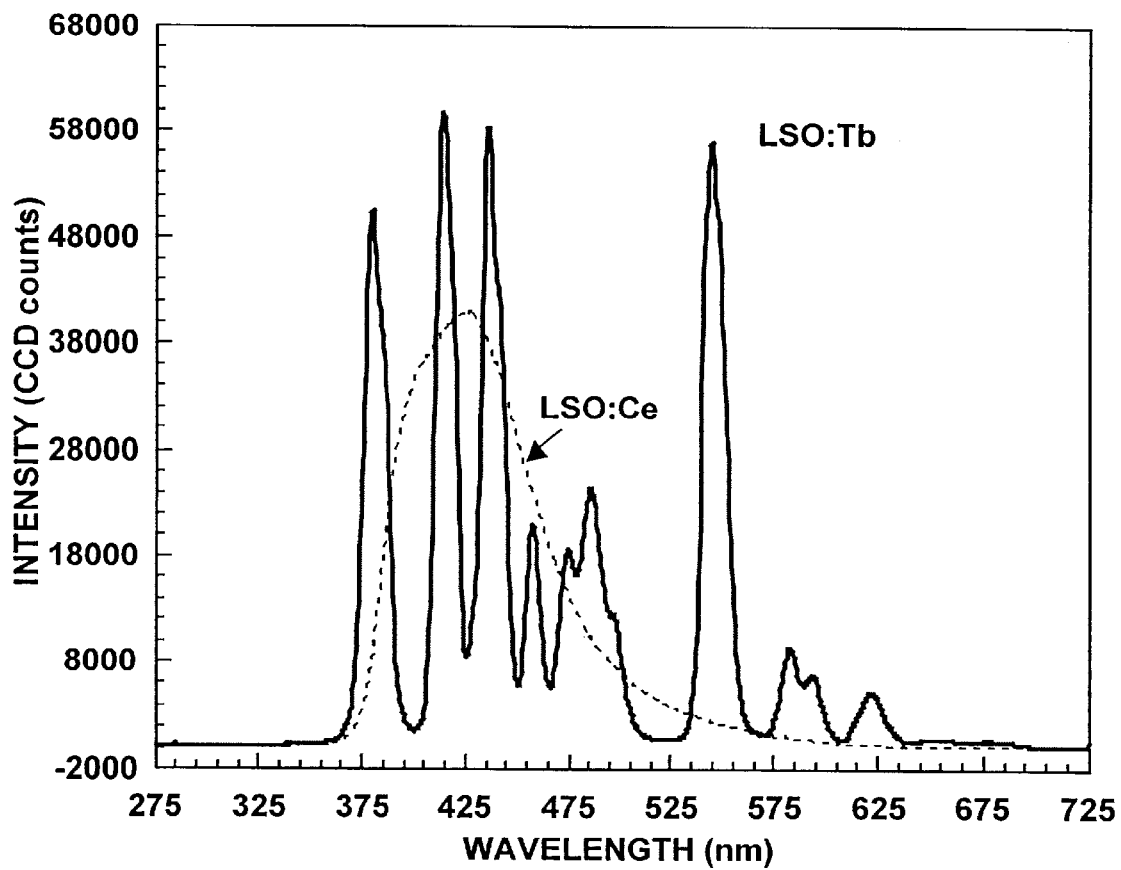
FIG. 6 shows an optical emission spectrum for a LSO:Tb phosphor of the invention and an optical emission spectrum of LSO:Ce for comparison.

FIGS. 4–6 show the optical emission spectra for LSO:Tm, LSO:Sm, and LSO:Tb, respectively. The optical emission spectrum of LSO:Ce is included in each figure for comparison. As FIGS. 4–6 show, LSO:Tm, LSO:Sm, and LSO:Tb all appear to exhibit an emission characteristic of the corresponding dopant. In contrast to LSO:Eu, LSO:Pr, and LSO:Yb previously described, LSO:Tm, LSO:Sm, and LSO:Tb exhibit exceptionally intense luminescence peaks in their corresponding spectra. Unexpectedly, these three crystals maximum exhibited emission intensities equal to or exceeding the maximum emission intensity of LSO:Ce. In short, the invention phosphors LSO:Sm, LSO:Tb, and LSO:Tm of the invention are exceptionally good phosphors.

Crystal phosphors of the invention emit light in response to gamma rays, x-rays, and like radiation incident upon the crystal phosphor and can optically be coupled to a photodetector to produce a scintillation detector. The photodetector produces an electrical signal in response to light produced from the crystal phosphor. The phosphor crystal can be coupled to the photodetector by any of a variety of well-known coupling mechanisms or devices such as optical fibers, lenses, mirrors, grease, etc. Any crystal phosphor of the invention, and preferably those crystal phosphors of the invention having a luminescence (LSO:Sm, LSO:Tb, LSO:Tm to name just a few), may be used to produce a scintillation detector. A wide variety of photodetectors, such as photomultiplier tubes, photodiodes, microchannel plates, charge-coupled devices (such as video cameras) and the like, can be combined with the phosphor crystal of the invention to produce a radiation detector of the invention.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A transparent crystalline phosphor consisting essentially of lutetium yttrium oxyorthosilicate activated with a rare-earth metal dopant M and having the general formula Lu$_{(2-x-z)}$Y$_x$M$_z$SiO$_5$, wherein $0.00 \leq x \leq 1.95$, and $0.001 \leq z \leq 0.02$, and wherein M is selected from the group consisting of Sm, Tb, Tm, Eu, Yb, and Pr.

2. The transparent crystalline phosphor of claim 1, wherein $0.20 \leq x \leq 1.80$.

3. A transparent crystalline phosphor consisting essentially of lutetium oxyorthosilicate activated with a rare-earth metal dopant M and having the general formula Lu$_{(2-z)}$M$_z$SiO$_5$, wherein $0.001 \leq z \leq 0.02$, and wherein M is selected from the group consisting of Sm, Tb, Tm, Eu, Yb, and Pr.

4. A radiation detector, comprising:

(a) a transparent crystalline phosphor consisting essentially of lutetium yttrium oxyorthosilicate activated with a rare-earth metal dopant M and having the general formula Lu$_{(2-x-z)}$Y$_x$M$_z$SiO$_5$, wherein $0.00 \leq x \leq 1.95$, wherein $0.001 \leq z \leq 0.02$, and wherein M is selected from the group consisting of Sm, Tb, Tm, Eu, Yb, and Pr; and (b) a photodetector optically coupled to said phosphor for detecting light from said phosphor.

5. The radiation detector of claim 4, wherein $0.20 \leq x \leq 1.80$.

6. A radiation detector, comprising:

(a) a transparent crystalline phosphor consisting essentially of lutetium oxyorthosilicate activated with a rare-earth metal dopant M and having the general formula Lu$_{(2-z)}$M$_z$SiO$_5$, wherein $0.001 \leq z \leq 0.02$, and wherein M is selected from the group consisting of Sm, Tb, Tm, Eu, Yb, and Pr; and (b) a photodetector optically coupled to said phosphor for detecting light from said phosphor.

7. A transparent crystalline phosphor consisting essentially of lutetium gadolinium oxyorthosilicate activated with a rare-earth metal dopant M and having the general formula Lu$_{(2-x-z)}$Gd$_x$M$_z$SiO$_5$, wherein $0.00 \leq x \leq 1.95$, wherein $0.001 \leq z \leq 0.02$, and wherein M is selected from the group consisting of Sm, Tb, Tm, Eu, Yb, and Pr.

8. The transparent crystalline phosphor of claim 7, wherein $0.20 \leq x \leq 1.80$.

9. A radiation detector, comprising:

(a) a transparent crystalline phosphor consisting essentially of lutetium gadolinium dxyorthosilicate activated with a rare-earth metal dopant M and having the general formula $Lu_{(2-x-z)}Gd_xM_zSiO_5$, wherein $0.05 \leq x \leq 1.95$, wherein $0.001 \leq z \leq 0.02$, and wherein M is selected from the group consisting of Sm, Tb, Tm, Eu, Yb, and Pr; and (b) a photodetector optically coupled to said phosphor for detecting light from said phosphor.

10. The radiation detector of claim 9, wherein $0.20 \leq x \leq 1.80$.

11. A transparent crystalline phosphor consisting essentially of gadolinium yttrium oxyorthosilicate activated with a rare-earth metal dopant M and having the general formula $Gd_{(2-x-z)}Y_xM_zSiO_5$, wherein $0.00 \leq x \leq 1.95$, wherein $0.001 \leq z \leq 0.02$, and wherein M is selected from the group consisting of Sm, Tm, Eu, Yb, and Pr.

12. The transparent crystalline phosphor of claim 11, wherein $0.20 \leq x \leq 1.80$.

13. The transparent crystalline phosphor of claim 11, wherein x=0.

14. A radiation detector, comprising:

(a) a transparent crystalline phosphor consisting essentially of activated gadolinium yttrium oxyorthosilicate having the general formula $Gd_{(2-x-z)}Y_xM_zSiO_5$, wherein $0.00 \leq x \leq 1.95$, and $0.001 \leq z \leq 0.02$, and wherein M is selected from the group consisting of Sm, Tm, Eu, Yb, and Pr; and (b) a photodetector optically coupled to said phosphor for detecting light from said phosphor.

15. The radiation detector of claim 14, wherein $0.20 \leq x \leq 1.80$.

16. The radiation detector of claim 14, wherein x=0.

* * * * *